United States Patent
Yang et al.

(10) Patent No.: US 7,566,653 B2
(45) Date of Patent: Jul. 28, 2009

(54) INTERCONNECT STRUCTURE WITH GRAIN GROWTH PROMOTION LAYER AND METHOD FOR FORMING THE SAME

(75) Inventors: Chih-Chao Yang, Glenmont, NY (US); Daniel C. Edelstein, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/831,149

(22) Filed: Jul. 31, 2007

(65) Prior Publication Data
US 2009/0035954 A1   Feb. 5, 2009

(51) Int. Cl.
*H01L 21/00* (2006.01)

(52) U.S. Cl. .............. 438/627; 438/629; 438/643; 438/648; 438/656; 438/685; 257/E21.171; 257/E21.174; 257/E21.581; 257/E21.583; 257/E21.585

(58) Field of Classification Search ......... 438/637–640, 438/672, 675, 629, 627, 643, 648, 653, 656, 438/685, 687; 257/E21.171, 174, 581, 583, 257/584, 585, E23.145
See application file for complete search history.

(56) References Cited

U.S. PATENT DOCUMENTS

| | | | |
|---|---|---|---|
| 5,098,860 A | 3/1992 | Chakravorty et al. | |
| 5,930,669 A | 7/1999 | Uzoh | |
| 5,933,753 A | 8/1999 | Simon et al. | |
| 6,242,349 B1* | 6/2001 | Nogami et al. | 438/687 |
| 6,383,920 B1 | 5/2002 | Wang et al. | |
| 6,403,466 B1* | 6/2002 | Lopatin | 438/627 |
| 6,429,519 B1 | 8/2002 | Uzoh | |
| 6,528,884 B1* | 3/2003 | Lopatin et al. | 257/758 |
| 6,559,546 B1* | 5/2003 | Achuthan et al. | 257/758 |
| 6,680,249 B2* | 1/2004 | Lu et al. | 438/653 |
| 6,831,003 B1* | 12/2004 | Huang et al. | 438/627 |
| 2006/0199372 A1* | 9/2006 | Chung et al. | 438/628 |
| 2006/0286800 A1 | 12/2006 | Dominguez et al. | |
| 2007/0087555 A1* | 4/2007 | Greco et al. | 438/618 |
| 2007/0202689 A1* | 8/2007 | Choi et al. | 438/637 |

* cited by examiner

*Primary Examiner*—Michael S Lebentritt
(74) *Attorney, Agent, or Firm*—Joseph Petrokaitis; Hoffman Warnick LLC

(57) ABSTRACT

In general, the present invention provides an interconnect structure and method for forming the same. This present invention discloses an interconnect structure includes a Cu seeding layer embedded between a diffusion barrier layer and a grain growth promotion layer. Specifically, under the present invention, a diffusion barrier layer is formed on a patterned inter-level dielectric layer. A (Cu) seeding layer is then formed on the diffusion barrier layer, and a grain growth promotion layer is formed on the seeding layer. Once the grain growth promotion layer is formed, post-processing steps (e.g., electroplating and chemical-mechanical polishing) are performed.

14 Claims, 10 Drawing Sheets

INTERCONNECT STRUCTURE WITH GRAIN GROWTH PROMOTION LAYER AND METHOD FOR FORMING THE SAME

BACKGROUND OF THE INVENTION

1. Field of the Invention

In general the present invention relates to interconnect structures. Specifically, the present invention relates to an interconnect structure having a grain growth promotion layer on top of a Cu plating seed layer.

2. Related Art

With continual shrinking of interconnect structures, an advanced copper (Cu) metallization process is required to maintain/optimize a final Cu microstructure. In a traditional approach, the Cu plating process is performed directly on top of a Cu seeding layer. After that, a high temperature annealing process is carried out for Cu grain growth. However, it has been observed that the grain growth rate is faster in the plated Cu than in the seeding layer, which then results in small grains at the bottom of the interconnect features.

A demonstration of an existing approach is shown in FIG. 1. Specifically, as shown, an interconnect structure 10 is formed by forming a Cu seeding layer 12 directly on a diffusion barrier layer 14. However, as mentioned above, with the continual shrinkage of these structures, grain growth rates need to improve. In view of the foregoing, there exists a need for an interconnect structure and method for forming the same that addresses these issues.

SUMMARY OF THE INVENTION

In general, the present invention provides an interconnect structure and method for forming the same. Specifically, under the present invention, a diffusion barrier layer (e.g., Ta, Ti, Ru, W, and/or related nitride materials) is formed on a patterned inter-level dielectric layer (e.g., having at least one trench and at least one via). A seeding layer (e.g., Cu and/or related alloy materials) is then formed on the diffusion barrier layer, and a grain growth promotion layer (e.g., Ru, Ir, Rh, Mo, Re, Hf, Nb, Pt, and/or related alloy materials) is formed on the seeding layer. Once the grain growth promotion layer is formed, post-processing steps (e.g., electroplating and chemical-mechanical polishing) are performed. As described herein, the patterned inter-level dielectric layer is formed on a capping layer, and the capping layer is formed on an inter-level dielectric layer. Furthermore, the inter-level dielectric layer can include a dielectric barrier layer and a metal layer.

A first aspect of the present invention provides an interconnect structure, comprising: a diffusion barrier layer; a grain growth promotion layer; and a seeding layer interposed between the diffusion barrier layer and the grain growth promotion layer.

A second aspect of the present invention provides a method of forming an interconnect structure, comprising: patterning a dielectric layer for the interconnect structure; and depositing a diffusion barrier layer, a seeding layer, and a grain growth promotion layer on the patterned dielectric layer; and forming the interconnect structure.

A third aspect of the present invention provides a method for forming an interconnect structure, comprising: forming a first inter-level dielectric layer; forming a capping layer over the inter-level dielectric layer; forming a second inter-level dielectric layer over the capping layer; patterning the second inter-level dielectric layer; forming a diffusion barrier layer over the second inter-level dielectric layer; forming a seeding layer over the diffusion barrier layer; forming a grain growth promotion layer over the seeding layer; and forming the interconnect structure.

These and other aspects will be further described in the description below and accompanying drawings.

BRIEF DESCRIPTION OF THE DRAWINGS

These and other features of this invention will be more readily understood from the following detailed description of the various aspects of the invention taken in conjunction with the accompanying drawings in which.

Figure 1:
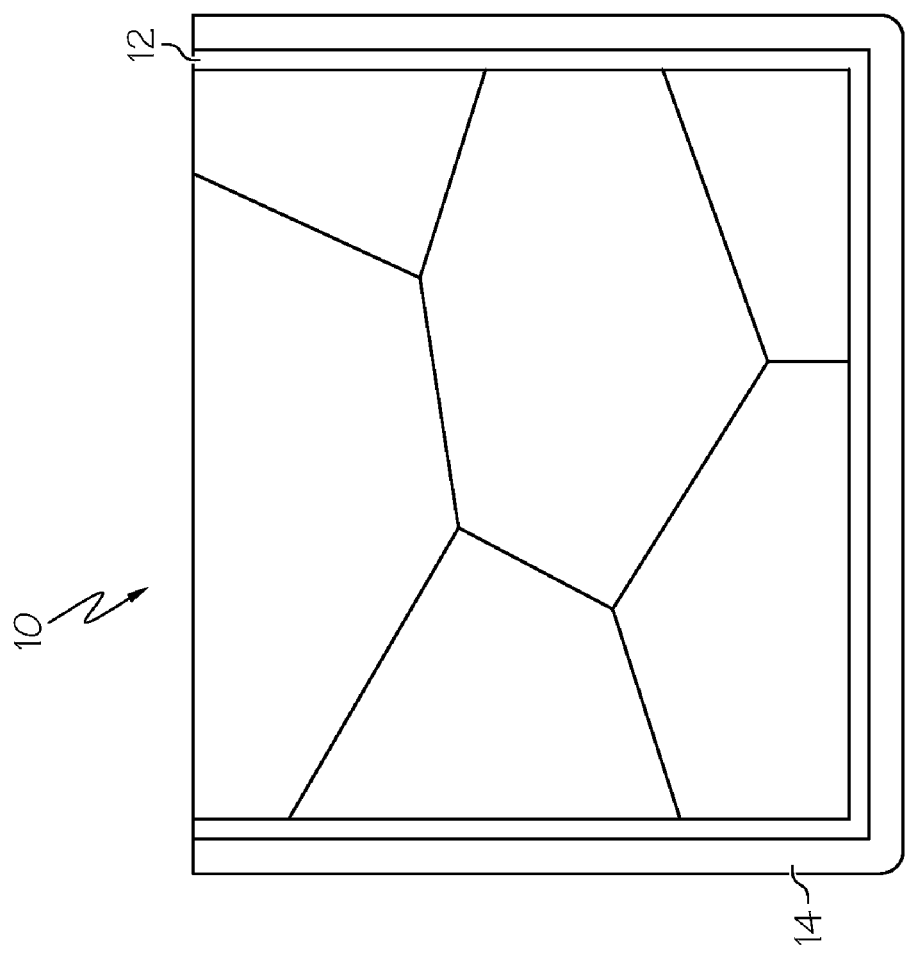
FIG. 1 depicts an interconnect structure according to the related art.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

For the purposes of this disclosure, the following abbreviations have the following meanings:

"Cu" means Copper
"Ta" means Tantalum
"Ti" means Titanium
"Ru" means Ruthenium
"W" means Tungsten
"Ir" means Iridium
"Rh" means Rhodium
"Mo" means Molybdenum
"Re" means Rhenium
"Hf" means Hafnium
"Nb" means Niobium
"Pt" means Platinum
"PVD" means Plasma Vapor Deposition
"CVD" means Chemical Vapor Deposition
"ALD" means Atomic Layer Deposition As indicated above, the present invention provides an interconnect structure and method for forming the same. Specifically, under the present invention, a diffusion barrier layer (e.g., Ta, Ti, Ru, W, and/or related nitride materials) is formed on a patterned inter-level dielectric layer (e.g., having at least one trench and at least one via). A seeding layer (e.g., Cu and/or related alloy materials) is then formed on the diffusion barrier layer, and a grain growth promotion layer (e.g., Ru, Ir, Rh, Mo, Re, Hf, Nb, Pt, and/or related alloy materials) is formed on the seeding layer. Once the grain growth promotion layer is formed, post-processing steps (e.g., electroplating and chemical-mechanical polishing) are performed. As described herein, the patterned inter-level dielectric layer is formed on a capping layer, and the capping layer is formed on an inter-level dielectric layer. Furthermore, the inter-level dielectric layer can include a dielectric barrier layer and a metal layer.

Figure 2:
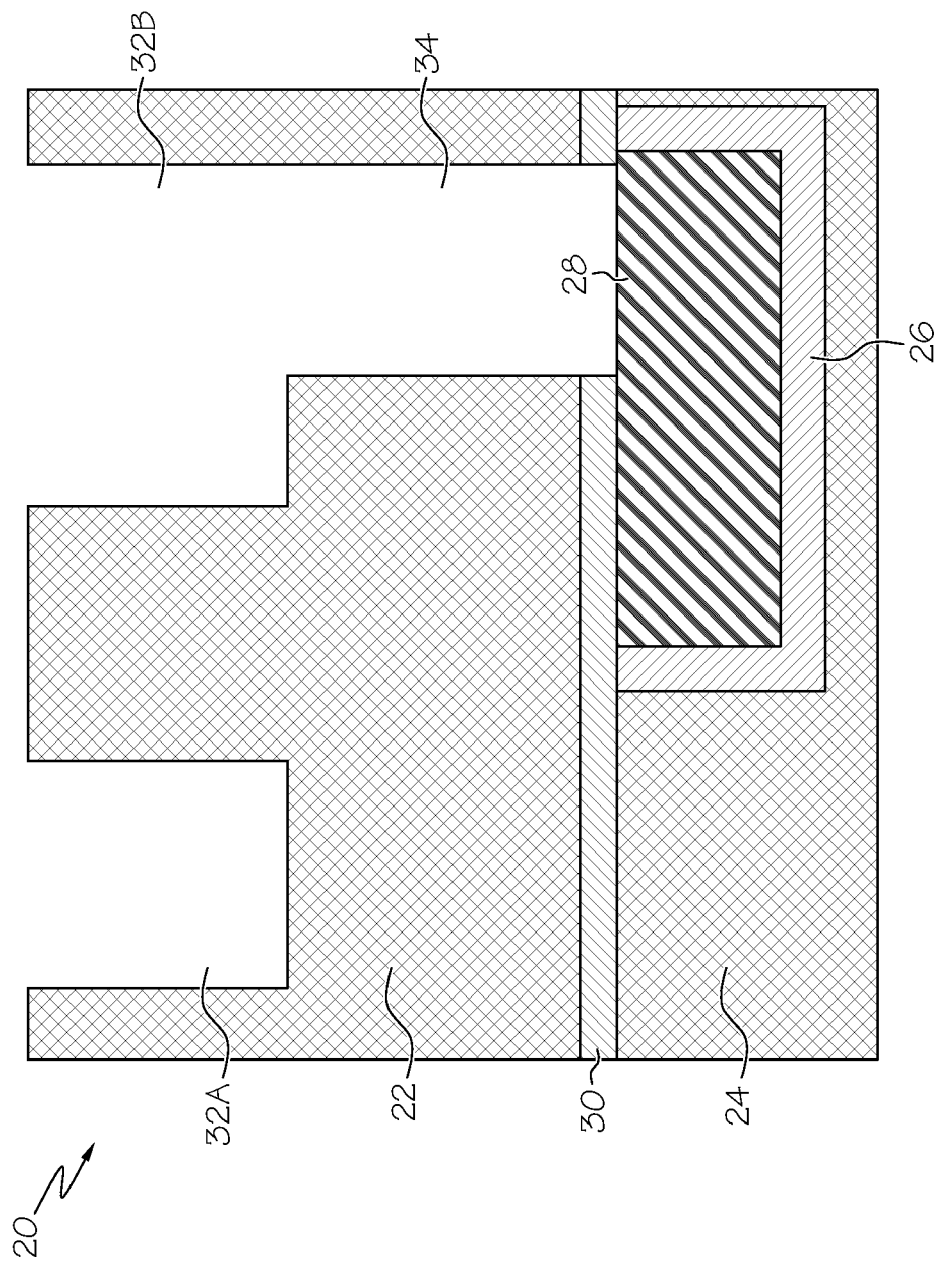
FIG. 2 depicts an interconnect structure after patterning of an inter-level dielectric layer according to the present invention.

Referring now to FIG. 2 an interconnect structure 20 after patterning of an inter-level dielectric layer 22 is shown. As further shown, patterned inter-level dielectric layer 22 is formed on a capping layer 30, which itself is formed on another inter-level dielectric layer 24. This inner layer dielectric layer 24 can also include a diffusion barrier layer 26 and a metal layer 28. As further shown in FIG. 2, the patterning of inner layer dielectric layer 22 can include the formation of at least one trench 32A-B and at least one via 34 (a single via 34 is shown for illustrative purposes only).

Figure 3:
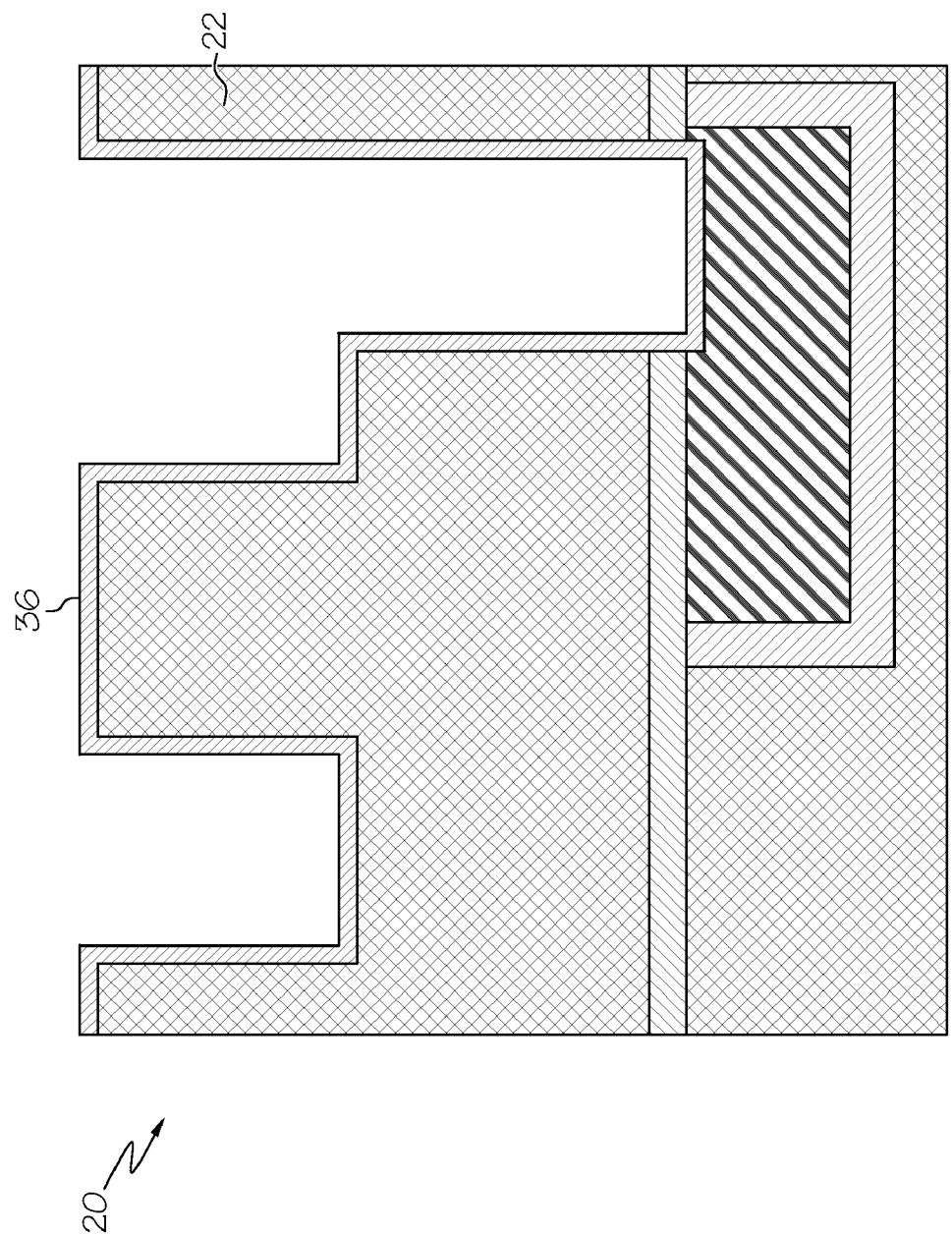
FIG. 3 depicts the interconnect structure of FIG. 2 after formation of a diffusion barrier layer according to the present invention.

FIG. 3 depicts the interconnect structure 20 of FIG. 2 after formation of a diffusion barrier layer 36. Specifically, diffusion barrier layer 36 comprises at least one material selected from a group consisting of Ta, Ti, Ru, W, and related nitride materials, and is formed on patterned inter-level dielectric layer 22.

Figure 4:
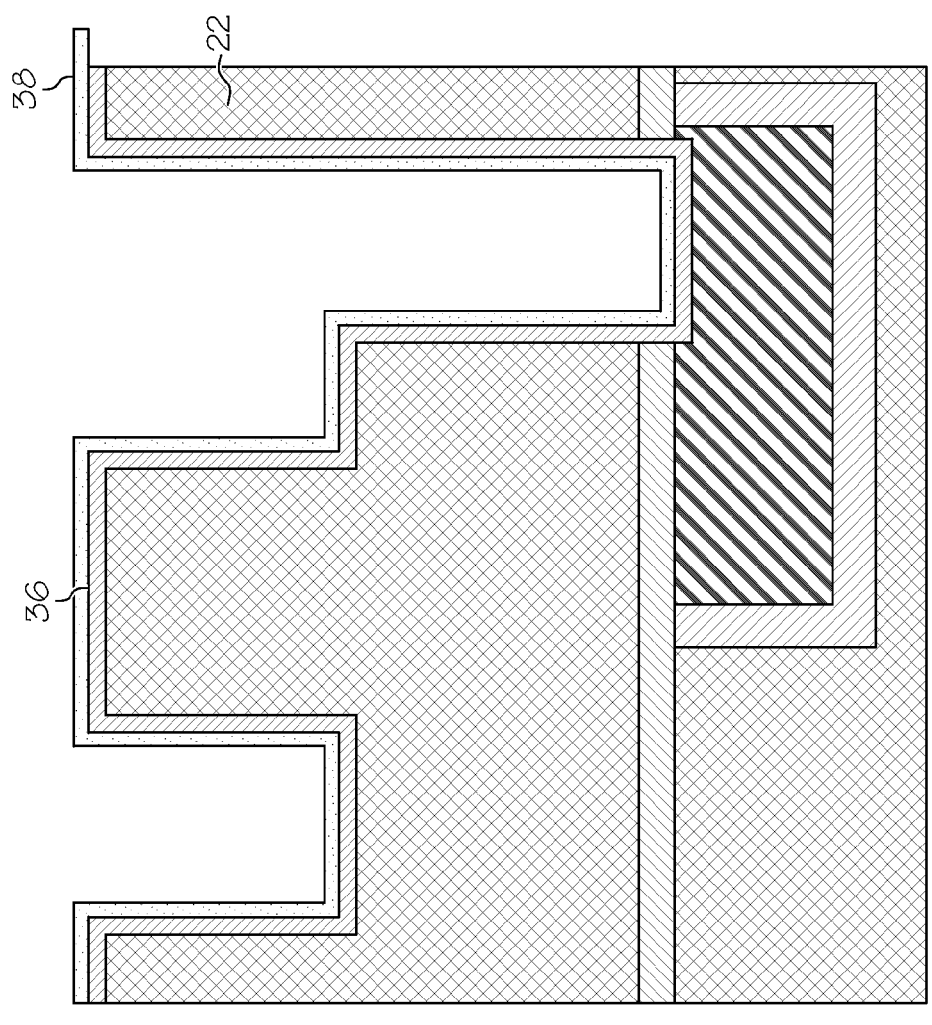
FIG. 4 depicts the interconnect structure of FIG. 3 after formation of a seeding layer according to the present invention

FIG. 4 depicts the interconnect structure of FIG. 3 after formation of a seeding layer 38 on diffusion barrier layer 36. Specifically, seeding layer 36 comprises at least one material selected from a group consisting of Cu, and related alloy materials, and has a thickness in a range of approximately 50 A to approximately 200 A.

Figure 5:
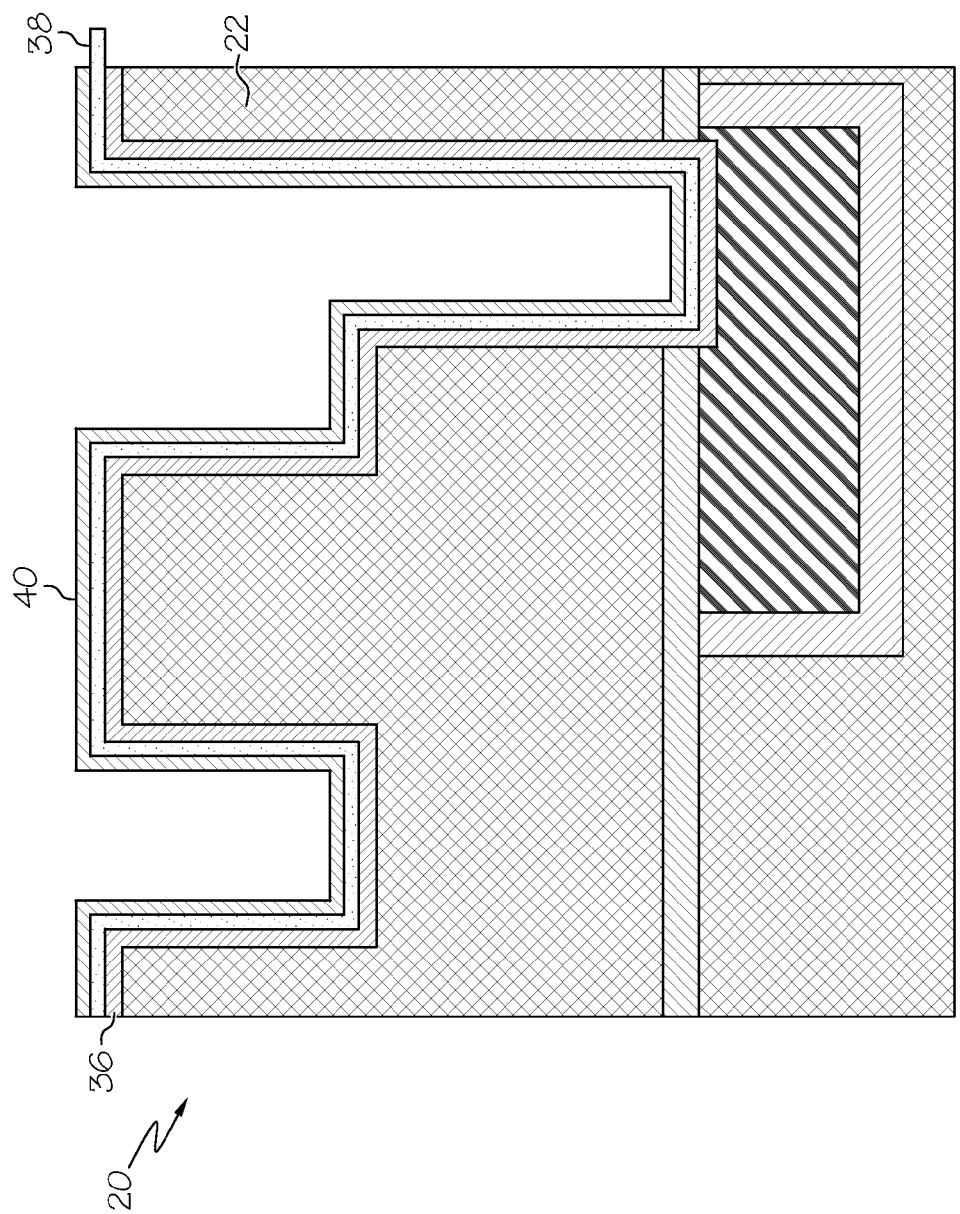
FIG. 5 depicts the interconnect structure of FIG. 4 after formation of a grain growth promotion layer according to the present invention.

FIG. 5 depicts the interconnect structure of FIG. 4 after formation of a grain growth promotion layer 40 on seeding layer 38. Specifically, grain growth promotion layer 40 comprises at least one material selected from a group consisting of Ru, Ir, Rh, Mo, Re, Hf, Nb, Pt, and related alloy materials, and has a thickness in a range of approximately 5 A to approximately 80 A. In any event, a result of these steps is to provide a bamboo copper microstructure.

Figure 6:
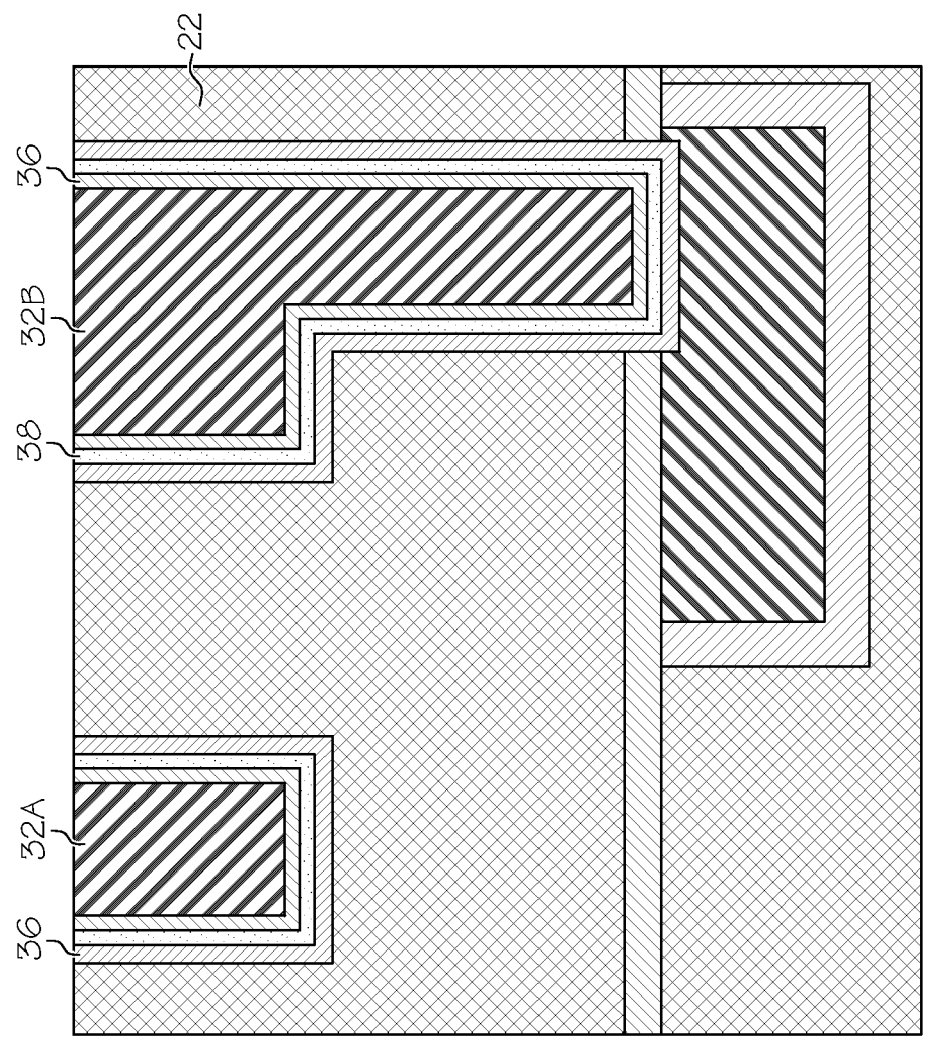
FIG. 6 depicts the interconnect structure of FIG. 5 after Cu electroplating and polishing according to the present invention.

FIG. 6 depicts the interconnect structure of FIG. 5 after post Cu electroplating and polishing. As can be, seen trenches 32A-B and via 34 have been electroplated and polished.

Figure 7:
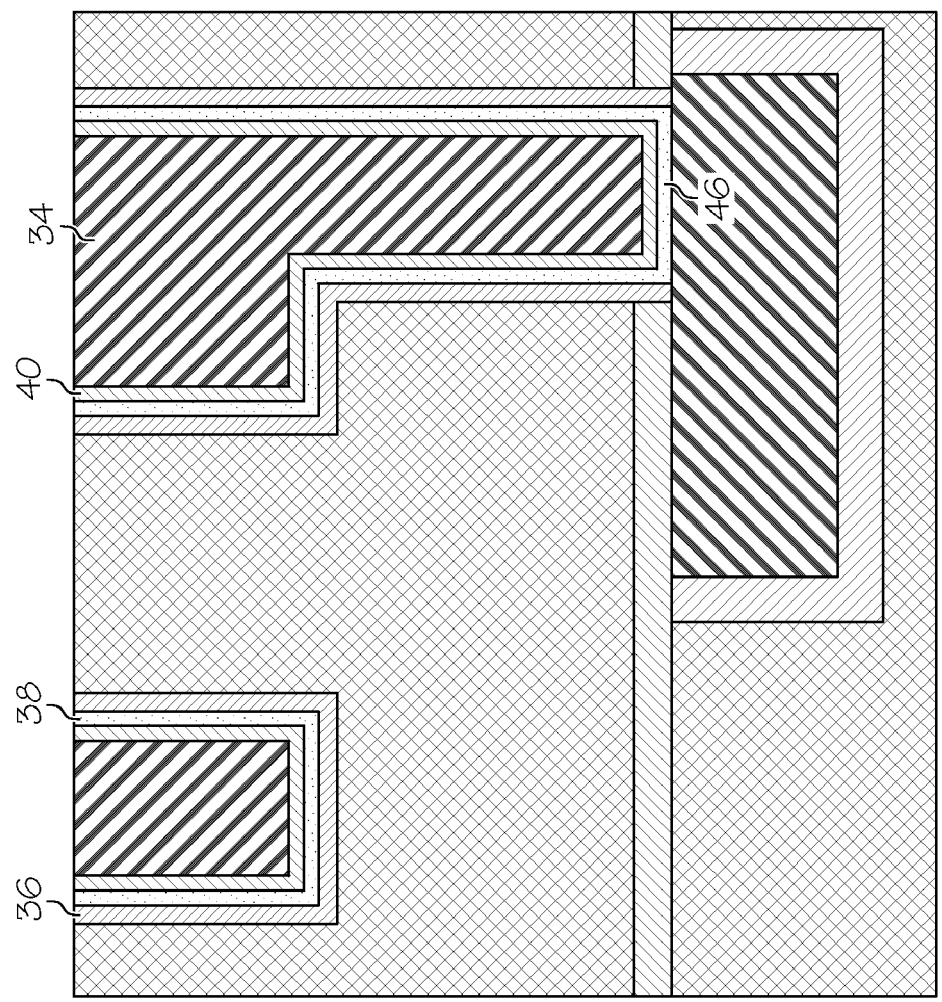
FIG. 7 depicts an alternate interconnect structure according to the present invention.

FIG. 7 depicts an alternate interconnect structure 44 according to the present invention. Specifically, interconnect structure 44 includes all of the layer/patterning of interconnect structure 20 of FIG. 6 (e.g., diffusion barrier layer 36, seeding layer 38, and grain growth promotion layer 40). One exception is that diffusion barrier layer 36 has been removed from a bottom surface 46 of via 34.

Figure 8:
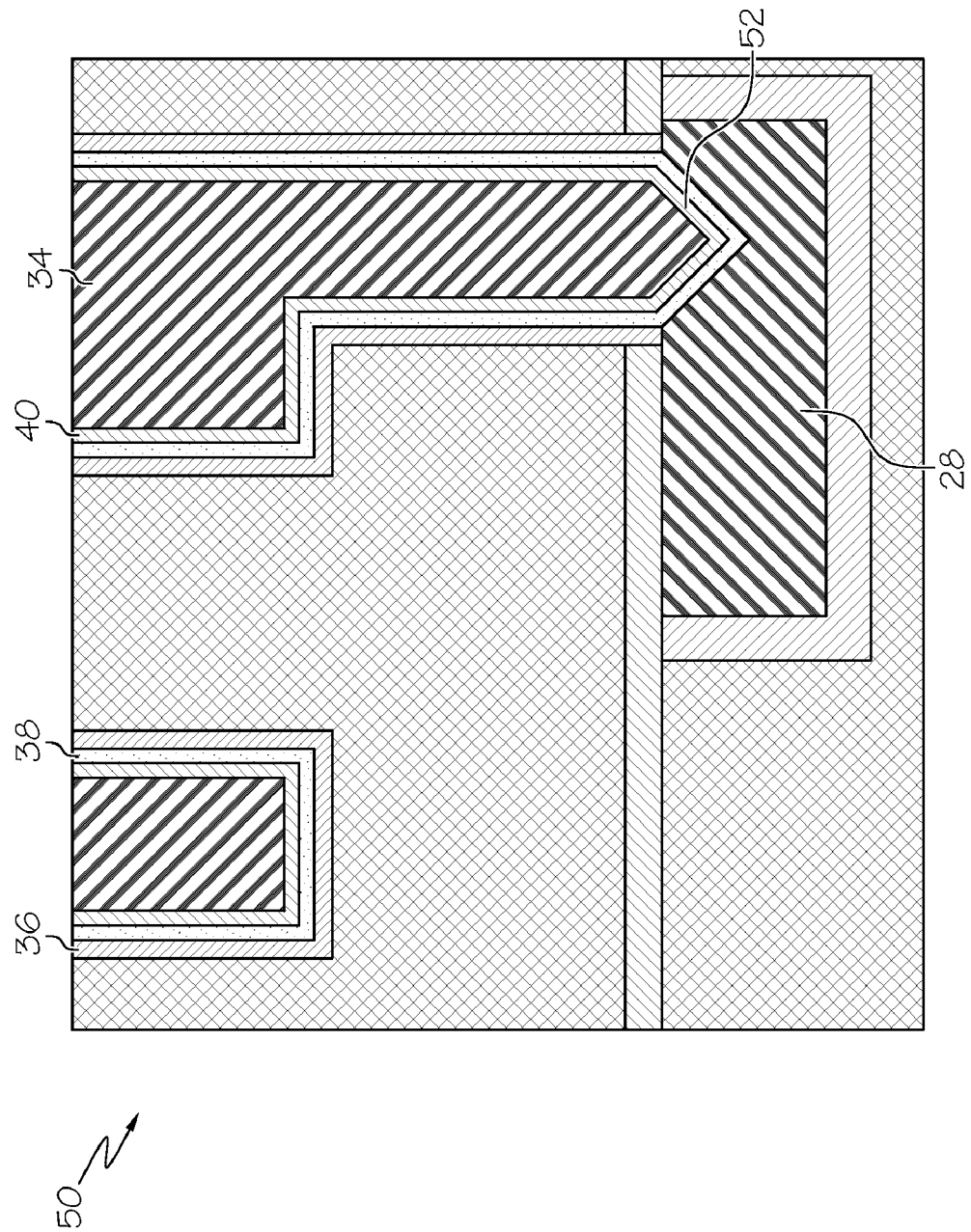
FIG. 8 depicts another alternate interconnect structure according to the present invention.

FIG. 8 depicts another alternate interconnect structure 50. Specifically, interconnect structure 50 includes all of the layer/patterning of interconnect structure 20 of FIG. 6 (e.g., diffusion barrier layer 36, seeding layer 38, and grain growth promotion layer 40). One exception is that via 34 includes a gouge 52 lined by seeding layer 38 and grain growth promotion layer 40, and that penetrates metal layer 28. It should be understood that interconnect structures 20, 44, and 50, all contain a Cu seeding layer 38 embedded between a diffusion barrier layer 36 and a grain growth promotion layer 40. For example, grain growth promotion layer 40 is formed directly on seeding layer 38, which is formed directly on diffusion barrier layer 36.

Figure 9:
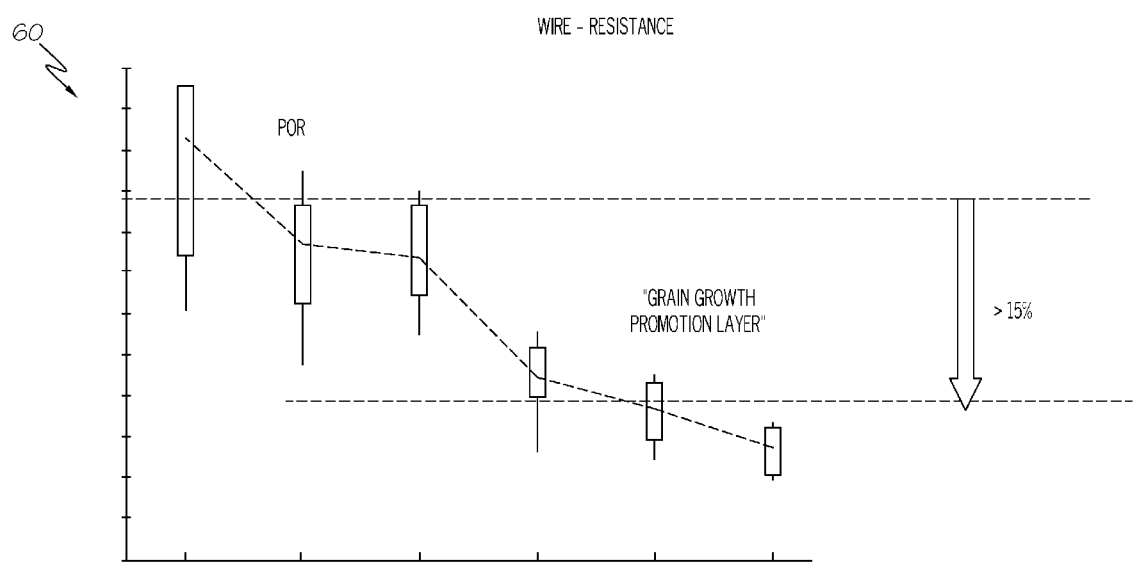
FIG. 9 depicts a graph showing circuit performance enhancement provided by the interconnect structures of the present invention.

FIG. 9 depicts a graph 60 showing circuit performance enhancement provided by the interconnect structures of the present invention. Specifically, graph 60 depicts the decreased wire resistance from an interconnect with a grain growth promotion layer. The wire resistance reduction is due to the existing grain growth promotion layer in the interconnect structure which results in bigger Cu grain size as compared to one without a grain growth promotion layer.

Figure 10:
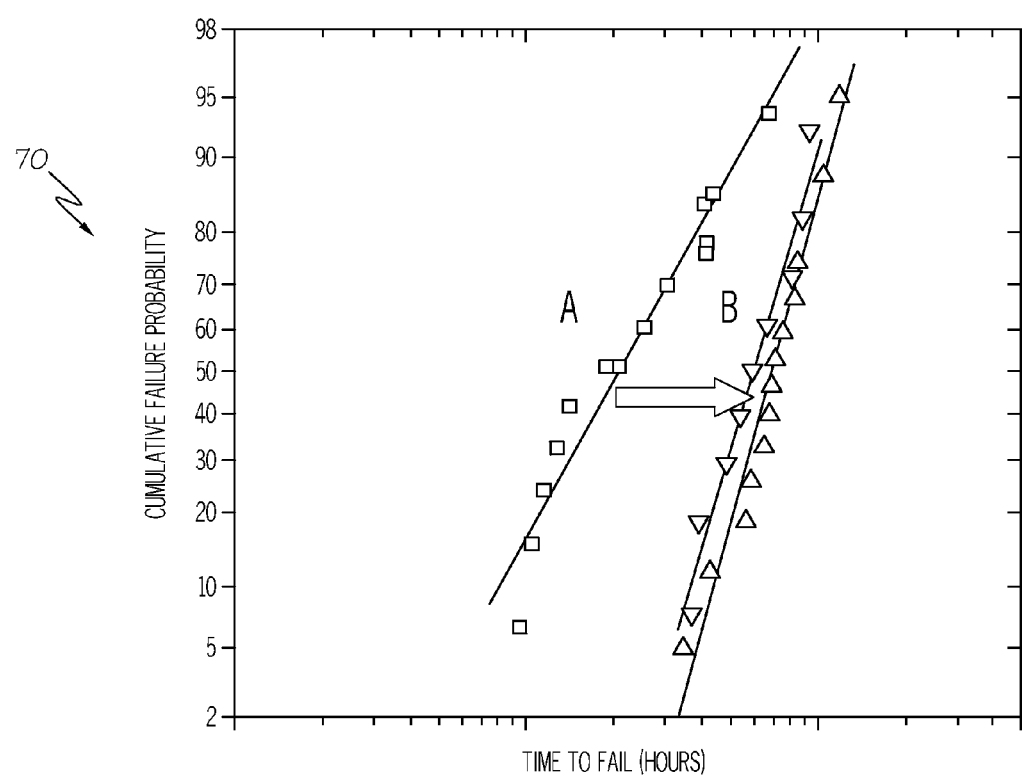
FIG. 10 depicts a graph showing improved reliability provided by the interconnect structures of the present invention.

FIG. 10 depicts a graph 70 showing improved reliability provided by the interconnect structures of the present invention. Specifically, graph 70 shows that time to fail (for an interconnect structure) is greater when a grain growth promotion layer is used (exhibited by curve B), than when a grain growth promotion layer is not used (exhibited by curve A).

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed:

1. An interconnect structure, comprising:
   a first diffusion barrier layer, the first diffusion barrier layer being formed on a patterned dielectric layer, the patterned dielectric layer being formed on a capping layer, the capping layer being formed on an inter-level dielectric layer, and the inter-level dielectric layer comprising a second diffusion barrier layer and a metal layer formed thereover;
   a grain growth promotion layer; and
   a seeding layer interposed between the first diffusion barrier layer and the grain growth promotion layer, the seeding layer being a copper seeding layer formed directly on the first diffusion barrier layer, and the grain growth promotion layer being formed directly on the seeding layer.

2. The interconnect structure of claim 1, the interconnect structure being a bamboo copper microstructure.

3. The interconnect structure of claim 1, further comprising at least one trench, and at least one via.

4. The interconnect structure of claim 3, the at least one via comprising a gouge that penetrates into a metal layer formed beneath the at least one via.

5. The interconnect structure of claim 1, the first diffusion barrier layer comprising at least one material selected from a group consisting of Ta, Ti, Ru, W, and nitride materials.

6. The interconnect structure of claim 1, the seeding layer comprising at least one material selected from a group consisting of Cu, and alloy materials.

7. The interconnect structure of claim 1, the grain growth promotion layer comprising at least one material selected from a group consisting of Ru, Ir, Rh, Mo, Re, Hf, Nb, Pt, and alloy materials.

8. The interconnect structure of claim 1, a thickness of the seeding layer being in a range of approximately 50 A to approximately 200 A.

9. The interconnect structure of claim 1, a thickness of the grain growth promotion layer being in a range of approximately 5 A to approximately 80 A.

10. A method of forming an interconnect structure, comprising:

forming a first dielectric layer, the first dielectric layer having a first diffusion barrier layer and a metal layer formed thereover;

forming a capping layer over the first dielectric layer;

patterning a second dielectric layer for the interconnect structure;

depositing a second diffusion barrier layer on the second dielectric layer, depositing a seeding layer on the second diffusion barrier layer, and depositing a grain growth promotion layer on the seeding layer, the patterning and depositing occurring within a single deposition chamber; and forming the interconnect structure.

11. The method of claim 10, the second diffusion barrier layer, the seeding layer, and the grain growth promotion layer being compatible with PYD, CYD, and ALD techniques.

12. A method for forming an interconnect structure, comprising:

forming a first inter-level dielectric layer, the first inter-level dielectric layer including a first diffusion barrier layer and a metal layer formed thereover;

forming a capping layer over the first inter-level dielectric layer;

forming a second inter-level dielectric layer over the capping layer;

patterning the second inter-level dielectric layer;

forming a second diffusion barrier layer over the second inter-level dielectric layer;

forming a seeding layer over the second diffusion barrier layer;

forming a grain growth promotion layer over the seeding layer; and forming the interconnect structure.

13. The method of claim 12, the patterning comprising forming at least one trench and at least one via in the second inter-level dielectric layer.

14. The method of claim 13, the at least one via containing a gouge.

* * * * *